United States Patent

Camerlenghi et al.

[11] Patent Number: 6,124,169
[45] Date of Patent: Sep. 26, 2000

[54] CONTACT STRUCTURE AND ASSOCIATED PROCESS FOR PRODUCTION OF SEMICONDUCTOR ELECTRONIC DEVICES AND IN PARTICULAR NONVOLATILE EPROM AND FLASH EPROM MEMORIES

[75] Inventors: Emilio Camerlenghi, Bergamo; Paolo Caprara, Milan; Gabriella Fontana, Agrate Brianza, all of Italy

[73] Assignee: STMicroelectronics, S.r.l., Agrate Brianza, Italy

[21] Appl. No.: 08/999,403

[22] Filed: Dec. 29, 1997

[30] Foreign Application Priority Data

Dec. 27, 1996 [EP] European Pat. Off. ............ 96830655

[51] Int. Cl.⁷ .................................................. H01L 21/8247
[52] U.S. Cl. ............................................. 438/263; 438/533
[58] Field of Search ..................................... 438/257–267, 438/533

[56] References Cited

U.S. PATENT DOCUMENTS

| | | |
|---|---|---|
| 4,512,073 | 4/1985 | Hsu ............................................. 29/571 |
| 4,780,424 | 10/1988 | Holler et al. . |
| 4,997,781 | 3/1991 | Tigelaar . |
| 5,420,060 | 5/1995 | Gill et al. . |
| 5,527,727 | 6/1996 | Kim . |
| 5,707,884 | 1/1998 | Fontana et al. . |
| 5,898,006 | 4/1999 | Kudoh . |

FOREIGN PATENT DOCUMENTS

| | | |
|---|---|---|
| 0 400 877 | 12/1990 | European Pat. Off. . |
| 63147318 | 6/1988 | Japan . |

*Primary Examiner*—Richard Booth
*Attorney, Agent, or Firm*—Theodore E. Galanthay, Esq.; Robert Iannucci, Esq.; Seed IP Law Group, PLLC

[57] ABSTRACT

A process creates contacts in semiconductor electronic devices and in particular on bit lines of non-volatile memories with cross-point structure. The cross-point structure includes memory cell matrices in which the bit lines are parallel unbroken diffusion strips extending along a column of the matrix with the contacts being provided through associated contact apertures defined through a dielectric layer deposited over a contact region defined on a semiconductor substrate at one end of the bit lines. The process calls for a step of implantation and following diffusion of contact areas provided in the substrate at opposite sides of each bit line to be contacted to widen the area designed to receive the contacts.

15 Claims, 8 Drawing Sheets

Silcon P substrate    _11_
*Fig. 6*
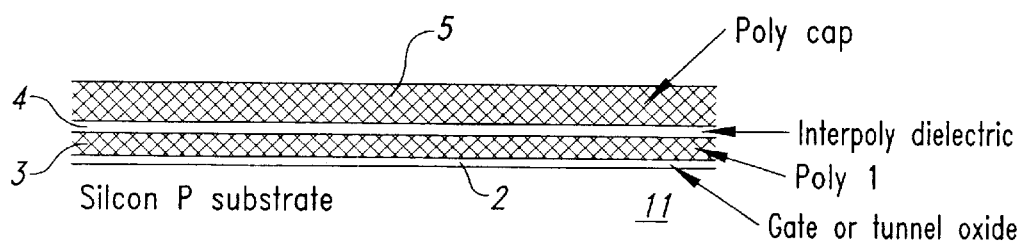
*Fig. 7*
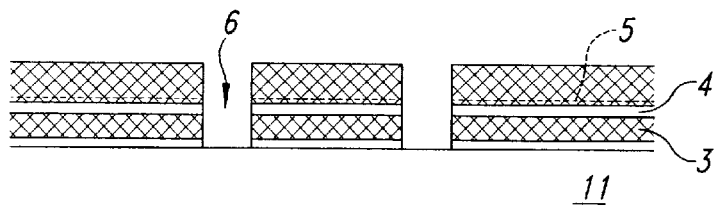
*Fig. 8*
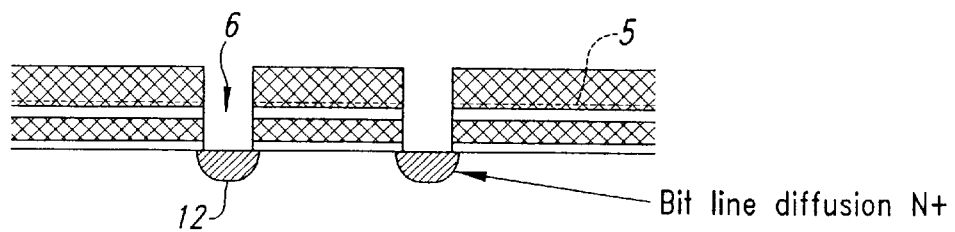
*Fig. 9*

CONTACT STRUCTURE AND ASSOCIATED PROCESS FOR PRODUCTION OF SEMICONDUCTOR ELECTRONIC DEVICES AND IN PARTICULAR NONVOLATILE EPROM AND FLASH EPROM MEMORIES

TECHNICAL FIELD

The present invention relates to a contact structure and to an associated manufacturing process for contacts in semiconductor electronic devices and in particular EPROM and Flash EPROM memories.

Specifically but not exclusively the present invention relates to a process for manufacturing contacts in semiconductor electronic devices and in particular in bit lines of non-volatile memories with cross-point structure comprising memory cell matrices in which the bit lines are parallel unbroken diffusion strips extending along a column of the matrix with the contacts being provided through associated contact apertures defined through a dielectric layer deposited over a contact region defined in a semiconductor substrate at one end of the bit lines.

BACKGROUND OF THE INVENTION

As known, the semiconductor electronic devices of EPROM and Flash EPROM memories comprise a plurality of non-volatile memory cells organized in matrices, i.e., the cells are organized in rows termed 'word lines' and columns termed 'bit lines.'

Each individual non-volatile memory cell comprises a MOS transistor in which a gate, which is located over a channel region, is floating, i.e., it presents a high impedance towards all other terminals of the same cell and of the circuit in which the cell is inserted.

The cell comprises also a second electrode, termed control gate, which is driven by appropriate control voltages. The other electrodes of the transistor are the usual drain, source and body terminals.

By applying appropriate voltages to the cell terminals it is possible to change a quantity of charge present in the floating gate, e.g., by utilizing the known Fowler-Nordheim Tunneling and/or Channel Hot Electrons Injection phenomena. This allows putting the transistor in two logical states: a first state with 'high' threshold voltage and a second state with 'low' threshold voltage.

Since the floating gate displays high impedance towards any other terminal of the cell, the charge stored therein can remain for an indefinite time even if the power supply of the circuit in which it is inserted is removed. The memory cell thus displays non-volatile memory characteristics.

The operation by means of which the charge is stored in the floating gate is termed 'programming' while the operation by means of which the charge is removed from the floating gate is termed 'erasing'.

Memory cells can be erased by ultraviolet (UV) radiation in EPROM memories or by electrical erasing in EEPROM or Flash-EPROM memories.

In recent years much effort has been expended to provide memory devices having an ever greater circuit density. This effort has led to the manufacturing of electrically programmable non-volatile memory matrices of the contactless type and with a so-called 'cross-point' structure. An example of this kind of matrix and the associated manufacturing process is described in European Patent No. 0 573 728 filed by the assignee of the present application.

In this type of matrix the memory cells have source/drain regions provided in the substrate and contacted with unbroken, parallel diffusion strips, denominated bit lines, which coincide substantially with the matrix columns.

In memory matrices having a structure of the conventional type this function is provided by metallization strips which connect individual contacts formed in the drain regions of the cells belonging to the same column.

A contactless matrix calls for the presence of a virtual ground circuitry for the reading and programming steps. However, savings in circuitry surface area obtained from such a structure is considerable and results in a reduction of approximately one order of magnitude in the number of contacts to be created.

Another reference for this kind of circuit architecture is the article, "Alternate Metal Virtual Ground (AMG)"—A New Scaling Concept for Very High Density EPROM's," by Boaz Eitan, IEEE August 1991, Vol 12, No. 8, which is incorporated herein by reference.

In this kind of virtual ground matrix are defined parallel strips of a multilayer comprising tunnel oxide, a first polysilicon layer, an interpoly dielectric and a final layer of polysilicon termed Poly Cap. In openings between the various polysilicon strips is performed an implant, e.g., of arsenic if the substrate is the P-type, to provide diffusion of the bit lines.

The bit lines are contacted alternately and with a predetermined periodicity and indeed the contacts are present only at opposite ends of the bit lines and are provided in opposing contact regions which delimit the circuit area designed to house the memory cells.

Formation of the contacts at the ends of the bit lines imposes definition of extremely accurate contact openings which entail technological problems of alignment of the contacts and definition of the associated metallization lines.

To better understand the aspects of the present invention it is well to consider the fact that to obtain a contact with good current leakage characteristics on an N+ doping region subjected to reverse biasing, it is indispensable that the contact be entirely contained in this N+ region.

In other words, assuming that the N+ doped region is a region implanted on a P-substrate and is subjected to a positive (>0) bias with respect to the ground biased substrate, if the contact were not contained with a good margin in the N+ region it could contact the P-substrate to give rise to a leakage current.

Accordingly, a good contact should always be contained within the N+ region while also allowing for design and manufacturing process tolerances. In a word, the contact can be provided with preset dimensional tolerances which should be considered in relation to the possible dimensional tolerances of the N+ region to be contacted and in relation to possible misalignments between the contact and the N+ region.

The prior art offers some solutions for avoiding shortcomings in the manufacturing of contacts in the virtual ground matrices.

A first solution calls for provision of an N+ area having a 'head' portion with dimensions sufficiently greater than the surface area occupied by the contact.

An example of this type of solution is shown in the annexed FIGS. 1 and 1A.

FIG. 1 shows a plan view in enlarged scale of a detail of the layout of a portion 10 of an electronic memory circuit integrated on a semiconductor substrate 11. This portion 10 comprises contact regions at one end of the bit lines.

In the substrate 11 are provided active area strips 19 which could be replaced by pads provided only opposite the contact regions. Orthogonal to these strips 19 there are unbroken parallel diffusions of bit lines 12 provided by implantation and visible in FIG. 1A.

In the course of the manufacturing process there is provided on the substrate 11 a multilayer structure comprising in superimposed order gate oxide, polysilicon, interpoly dielectric and a final layer of Poly Cap. The bit lines 12 are provided through parallel openings provided in this multilayer structure.

It is important to note that FIG. 1A, although it is a cross section along plane of cut A–A' of FIG. 1, does not correspond thereto from a temporal viewpoint but refers to the final steps of the manufacturing and contact creation process in the course of which the multilayer structure has already been removed from the contact region.

In the contact region and above the silicon substrate uncovered, there is deposited a protective dielectric layer 13 which is subjected to a photolithographic process step followed by a chemical or plasma etching to define contact openings 14 adjacent to the bit lines 12.

A contact 15 is provided within each of the openings 14 to allow establishment of an electrical connection between a bit line 12 and a corresponding metallization strip 16 deposited over the dielectric layer 13.

FIG. 1 shows parallel strips 17 of a first layer of polysilicon or Poly1 extending parallel to the bit lines and overlying the active area strips 19 in a direction orthogonal thereto. Adjacent to each contact 15 the strips 17 display a narrowing which confers a certain spacing to contact regions 18 in the center of which is provided a contact 15.

This spacing entails essentially definition of a contact region 18 sufficiently wide to allow provision by implantation of a type N+ region 12 having dimensions sufficiently greater than those of the contact 15.

A second solution proposed by the prior art requires that the contacts be realized by implantation contacting the N+ doped bit line through an appropriate opening. This solution is shown schematically in FIGS. 2 to 4A and is particularly recommended when the lateral dimensions of the N+ region 12 do not ensure sufficient processing margin.

Specifically there are some planarization technologies for the dielectrics which fill interspaces between the polysilicon strips which do not allow provision of polysilicon interspaces of variable dimensions but require that the width of the interspace remain constant to optimize the filling process. In these cases the spacing between two Poly1 strips is the minimum allowed by the technology and is just enough to define the area occupied by the contact 15.

FIG. 2 shows clearly that the spacing between the polysilicon strips is constant and essentially as wide as the contact 15. Consequently the contact 15 must be provided by means of a self-aligned implantation step.

In an ideal situation this implantation allows providing a contact perfectly self-aligned with the corresponding active area as shown in FIG. 2A.

But in some cases, differently from the ideal case, there may be misalignment between the contact 15 and the corresponding active area 12. This situation is diagrammed in FIGS. 3 and 3A in which it can be seen that the contact 15 contacts both the region 12 and the substrate 11.

To avoid this shortcoming it is necessary to prepare an additional masking for the implantation only of the contacts of the N+ region as shown in FIGS. 4 and 4A.

SUMMARY OF THE INVENTION

An object of the present invention is to conceive a process for the provision of a contact structure and in particular for integrated memory circuits which would have functional characteristics providing direct contact with the corresponding active area even in situations where the area available for the contact is very small and saving a masking step.

This would allow overcoming the limits and shortcomings of the present solutions proposed by the prior art for cross-point memory devices.

An embodiment of the present invention is that of utilizing an increase in the total width of the bit lines allowed by the implantation and subsequent diffusion of the N-channel selection transistor junctions associated with the memory cell matrix.

The characteristics and advantages of the process and contact structure in accordance with the present invention are set forth in the description of an embodiment thereof given below by way of non-limiting example with reference to the annexed drawings.

BRIEF DESCRIPTION OF THE DRAWINGS

FIGS. 6 to 17 shows schematically and in enlarged scale respective vertical cross section views of the portion of semiconductor substrate of FIG. 5 in the following processing steps in accordance with a process of the present invention.

DETAILED DESCRIPTION

Figure 1:
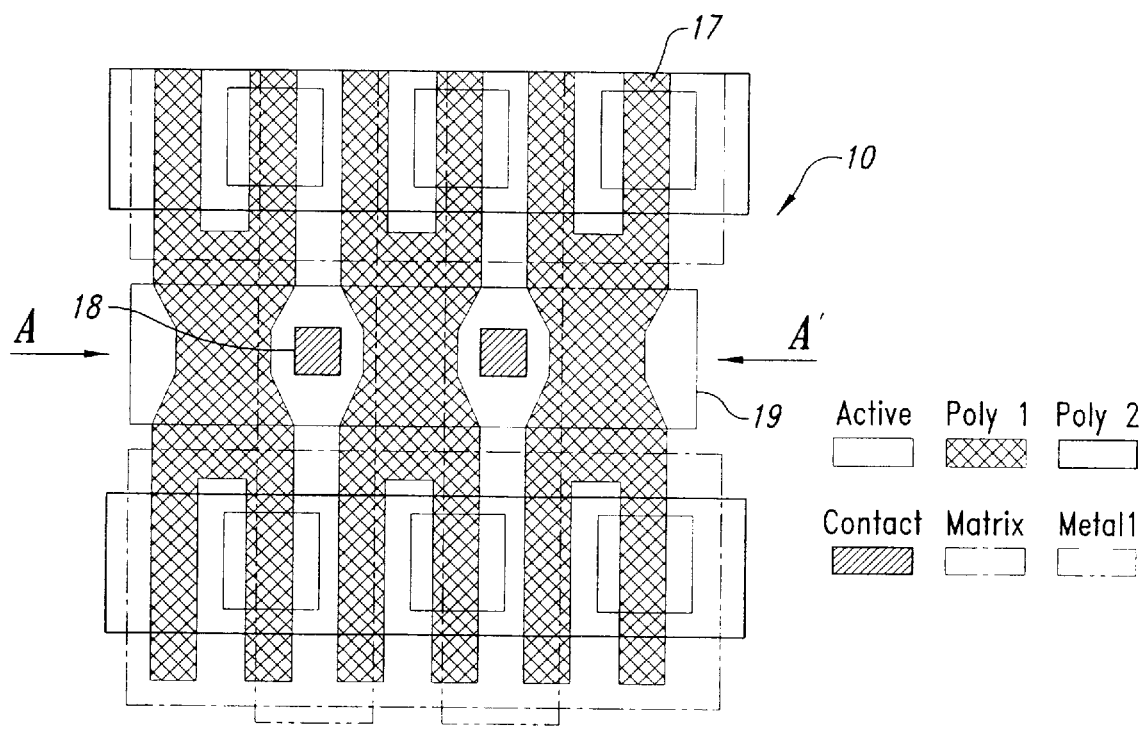
FIGS. 1 and 1A show schematically and in enlarged scale respective plan and vertical cross section views of a portion of semiconductor substrate comprising contact structures provided in accordance with a methodology proposed by the prior art.
Figure 1A:
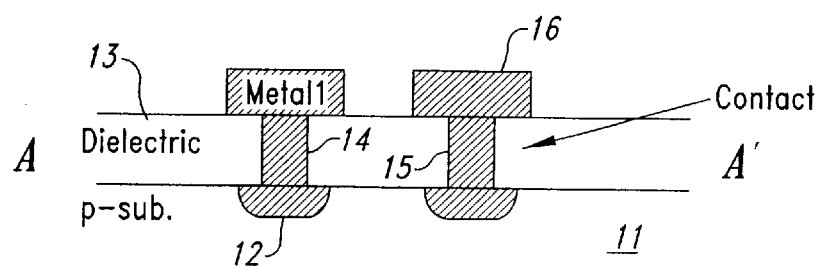
Figure 2:
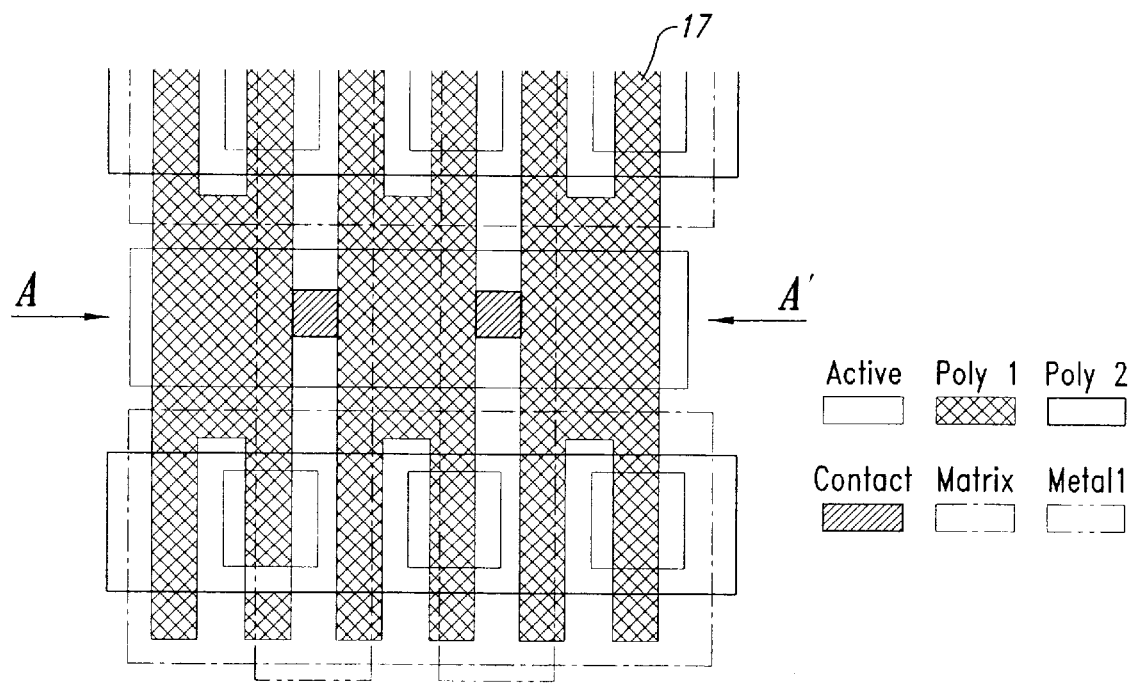
FIGS. 2 and 2A show schematically and in enlarged scale respective plan and vertical cross section views of a portion of semiconductor substrate comprising contact structures provided in accordance with a methodology proposed by the prior art.
Figure 2A:
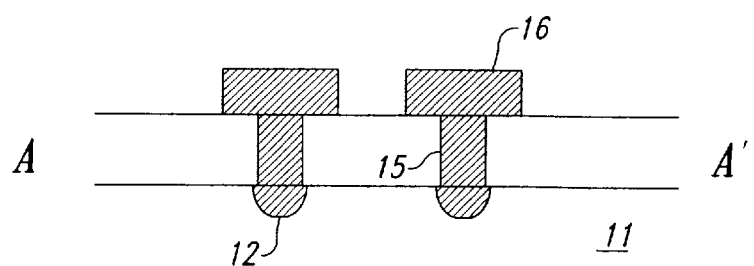
Figure 3:
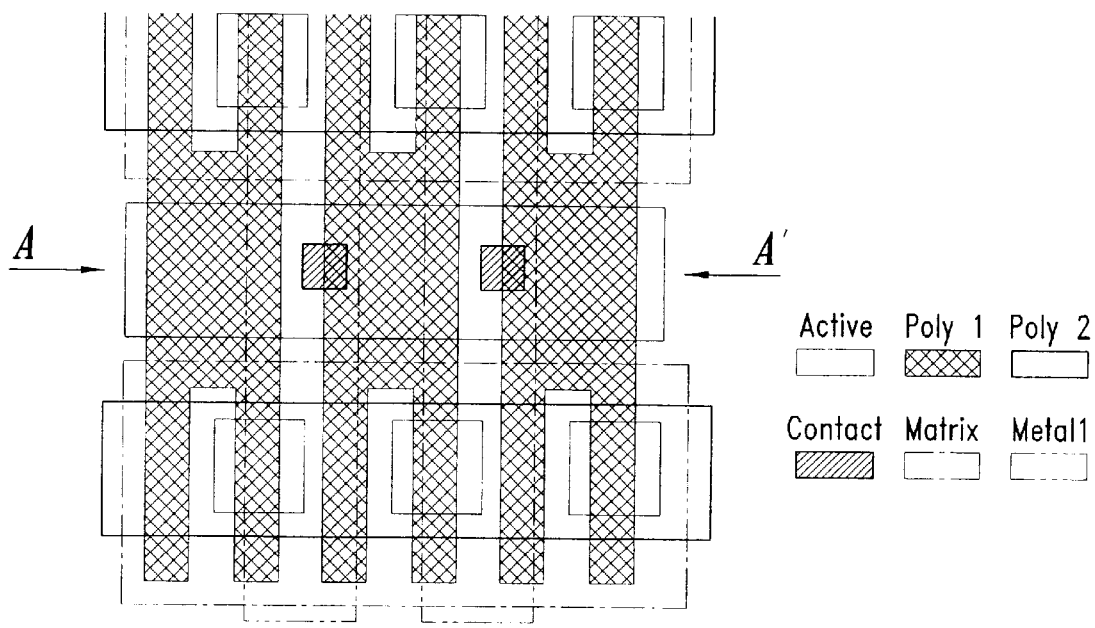
FIGS. 3 and 3A shows schematically and in enlarged scale respective plan and vertical cross section views of the portion of semiconductor substrate of FIG. 2 in the presence of contact structures misaligned with the associated regions to be contacted.
Figure 3A:
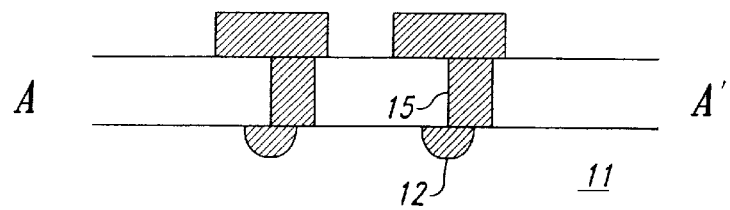
Figure 4:
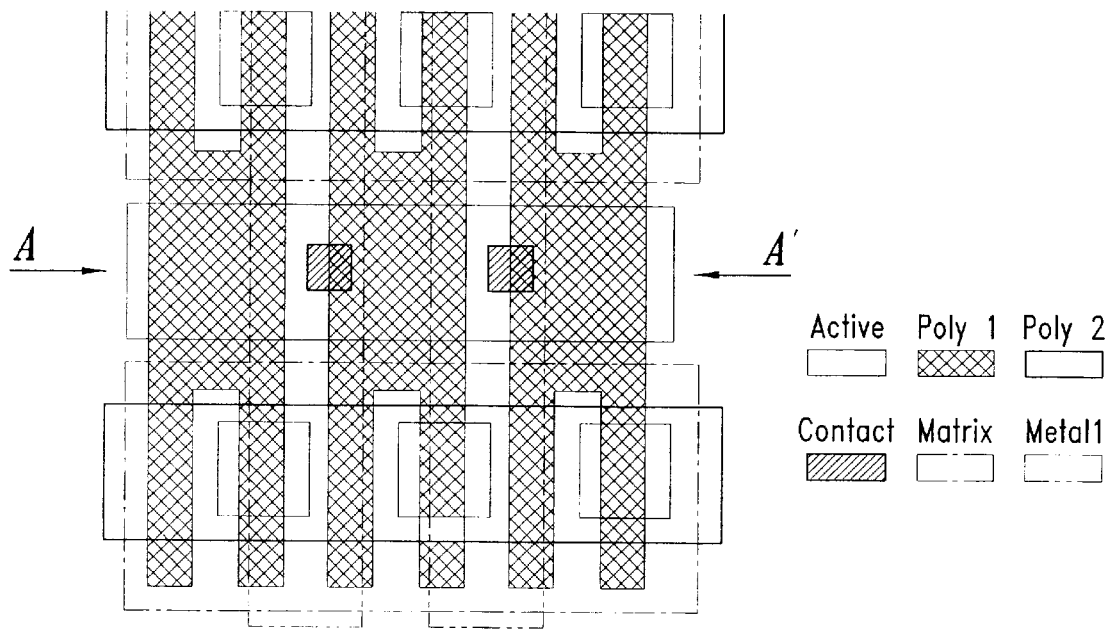
FIGS. 4 and 4A show schematically and in enlarged scale respective plan and vertical cross section views of the portion of semiconductor substrate of FIG. 3 subjected to an implantation step of an additional mask.
Figure 4A:
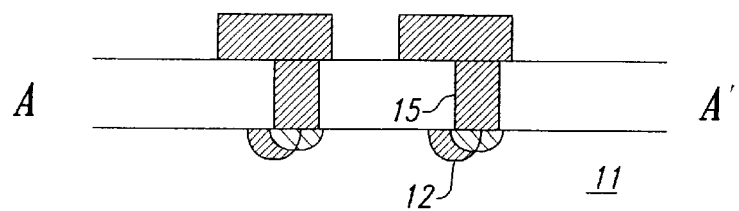

With reference to the above Figures and in particular to the examples of FIGS. 5 to 17 reference number I indicates as a whole and schematically a circuit portion of a semiconductor substrate 11 comprising contact structures provided in accordance with a process of the present invention.

The portion 1 is incorporated in an electronic memory circuit integrated on the semiconductor substrate 11 in accordance with a matrix architecture comprising a multiplicity of floating gate memory cells organized in rows and columns.

Specifically, but not exclusively, this matrix is the EPROM or Flash-EPROM type with cross point structure and virtual ground circuitry, e.g., as described in European Patent No. 0 573 728 in which are provided unbroken parallel diffusion strips 12, termed bit lines, aligned along the matrix columns.

FIG. 6 shows the starting base of the manufacturing process of the semiconductor substrate 11, i.e., a semiconductor substrate 11 containing impurities of a first type of dopant, e.g., type P.

Specifically the substrate 11 is prepared to receive the active areas of the memory cells and the selection transistors associated therewith through the formation of twin wells of a N-well and P-tub type in accordance with prior art procedures. For the purposes of the present invention however in the Figures is shown only the circuit portion 1 in which are provided the contact regions lying on a portion of substrate or on a P-type well adjacent to that which receives the memory cells. Indeed, as mentioned above, the contact regions are located at opposite ends of the bit lines.

Preliminary steps of the manufacturing process call for an initial step of masking allowing definition on the substrate 11 of the active area regions.

If necessary, the active areas can be insulated from each other by insulating regions termed field oxide.

Then there is grown a thin layer of thin oxide also termed gate oxide and necessary for provision of the selection transistors associated with the memory cells.

If necessary for reasons tied to the different thickness of thin oxide for a selection transistor and for a memory cell, another masking defines regions in which are provided the cells by removing from the active area regions the gate oxide previously deposited. This step also allows performing an implantation of the channel region in order to adjust the threshold of the floating gate transistors which make up the memory cells.

At this point, as shown in FIG. 7, one proceeds to provide the memory cells by growing a thin tunnel oxide layer 2 expressly designed for the floating gate transistors of the memory cells. Growth of the tunnel oxide takes place on the entire semiconductor in such a manner as to obtain also an increase in thickness of the gate oxide deposited previously.

Over this thin oxide layer 2 is provided a multilayer structure comprising:

a polysilicon layer 3 also identified as Poly1, a dielectric layer 4 termed Interpoly, e.g., ONO (Oxide-Nitride-Oxide), and a second polysilicon layer 5 also termed Poly Cap.

A masking step denominated Poly1 masking allows defining openings 6 through which to provide the bit lines 12 of the memory cell matrix. The bit lines extend orthogonally in the substrate with respect to the active area regions.

The openings 6 are opened by means of a cascaded etching step of the Poly Cap 5, the dielectric layer 4, the Poly1 layer 4 and the thin oxide 2 and if necessary the field oxide also where present. The etching continues until it brings to light the substrate 11 as shown in FIG. 8.

An implantation of N+ ions, e.g., arsenic ions, is applied to provide the strips 12 of the bit lines of the memory matrix. If the memory cell matrix is the EPROM type the bit lines 12 are identical and provided only by the implantation of arsenic ions. The resulting structure is shown in FIG. 9.

But if the memory cell matrix is the Flash type, alternating source and drain diffusions are provided by an implantation of arsenic + phosphorous ions and only arsenic ions respectively.

Figure 10:
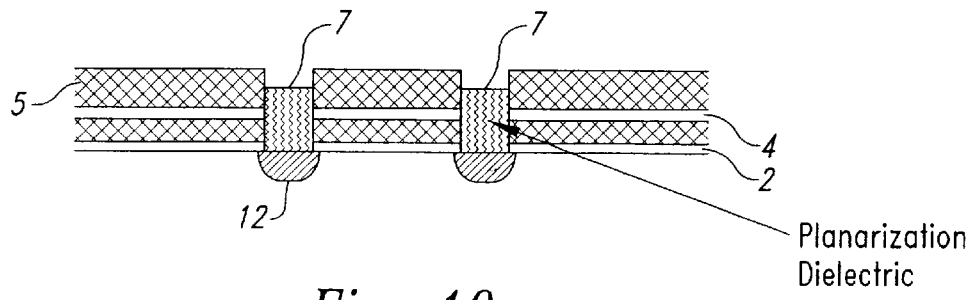

At this point is performed filling of the openings 6 which are closed by a planarizing dielectric layer 7 which takes on the configuration of a plug as shown in FIG. 10. This process step has the purpose of insulating the Poly1 walls which are designed to become the floating gates of the memory cells from a second polysilicon layer 8 which will be deposited subsequently.

The manufacturing process also provides that the Poly Cap layer 5 and the interpoly dielectric be removed over the areas of the selection transistors and circuitry associated with the memory matrix. This process step is not illustrated in the Figures because it is entirely conventional.

Figure 11:
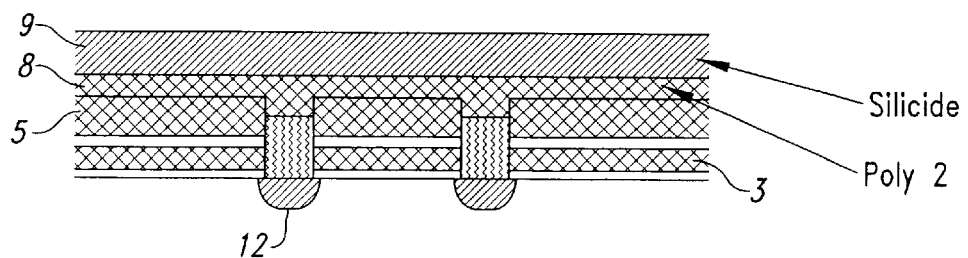

Over the cells is deposited a second polysilicon layer 8 termed Poly2 over which is also provided a silicide layer 9, e.g., tungsten silicide as shown in FIG. 11.

Then using a Poly2 masking there is performed a self-aligned etching of the silicide layer 9, the second polysilicon layer 8, the Poly Cap layer 5, the intermediate dielectric layer 4, the first polysilicon layer 3 and the thin oxide 2.

Figure 12:
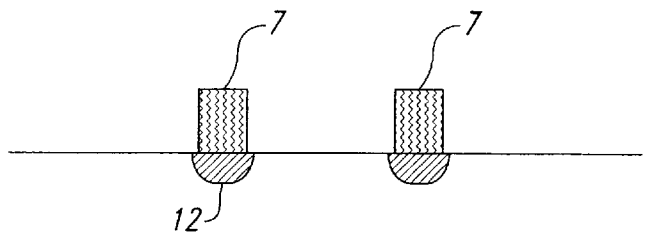

This etching defines the memory matrix word lines. As concerns the contact region, which is an object of the present invention, it is necessary to expose a good part of the semiconductor substrate 11. The result of this operation is shown in FIG. 12 from which it is clear that the etching of the word lines does not entirely uncover the silicon substrate 11 in the contact region since the planarized dielectric plugs 7 remain to cover the N+ bit line diffusions 12.

Other process steps, such as for example a second oxidation treatment to seal the N or P cells or implantations for active areas LDD of transistors peripheral to the matrix are not illustrated, for simplicity.

Figure 13:
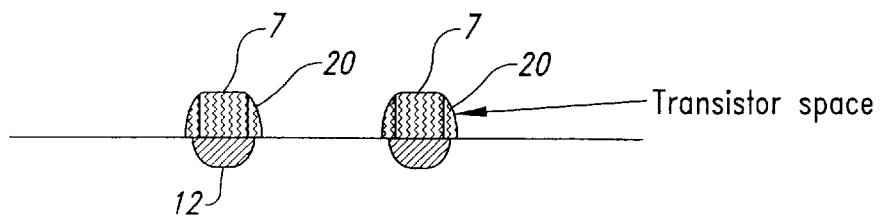

FIG. 13 illustrates the creation of so-called spacers 20 behind the dielectric plugs 7. The spacers 20 are provided at the sides of the gate regions of the transistors of the outside circuitry but, because of the presence of the residual plugs 7, they also form behind the latter.

The process continues with the provision by implantation and following diffusion of active N+ areas for the N-channel transistors and P+ active areas for the P-channel transistors making up part of the circuitry associated with the cell matrix. Advantageously by using the same mask used to create the N+ junctions of the transistors, in the contact region there are created by implantation N+ reception regions 22 provided in the substrate 11 at the opposite sides of each bit line to be contacted thanks to the shielding offered by the residual dielectric plug 7. These regions 22 merge by diffusion with the bit line region 12 to create a single contact area sufficiently wide to receive a metallic contact even in case of misalignment of the latter with respect to the bit line.

Figure 15:
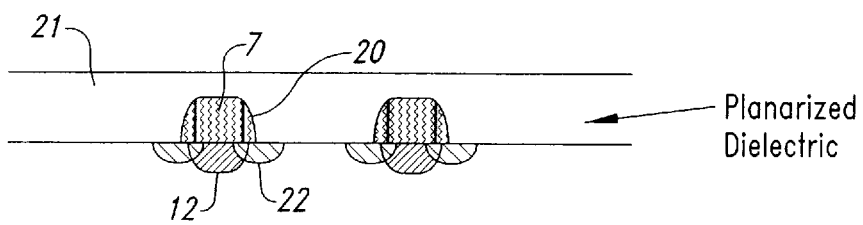

Following this implantation step a planarized dielectric layer 21 is deposited over the substrate 11 to cover the entire structure as shown in FIG. 15.

An appropriate contact masking defines the areas in which to provide contacts 25 through associated openings 24 made in the dielectric layer 21.

Figure 16:
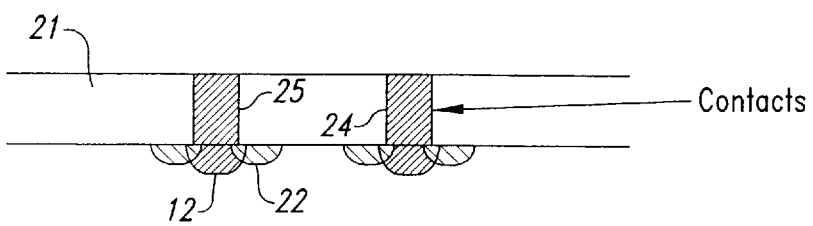

The contacts 25 are provided by deposit of a metallization layer entirely occupying each opening 24 as shown in FIG. 16.

Figure 5:
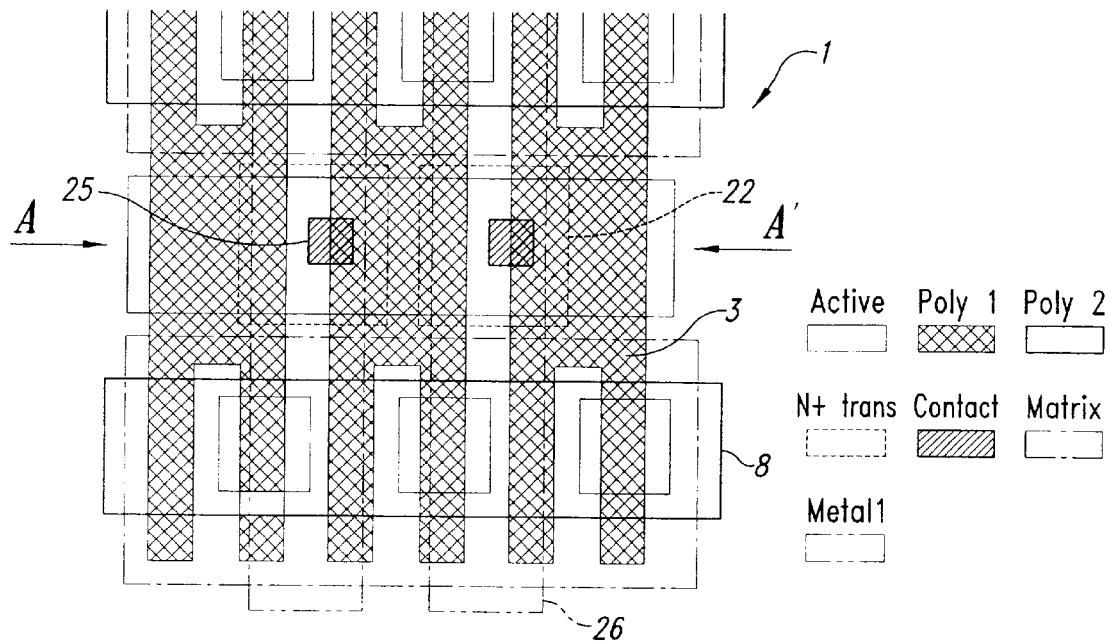
FIGS. 5 and 5A show schematically and in enlarged scale respective plan and vertical cross section views of a portion of semiconductor substrate comprising contact structures provided in accordance with a process of the present invention.
Figure 5A:
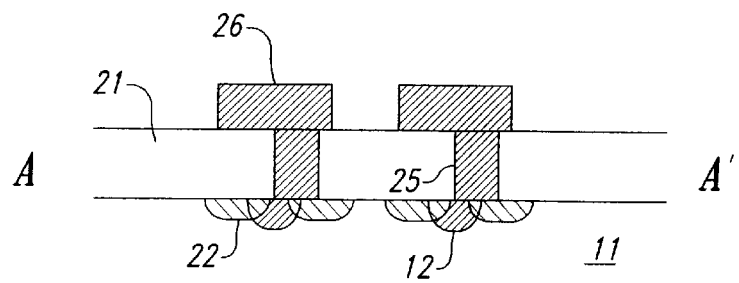
Figure 17:
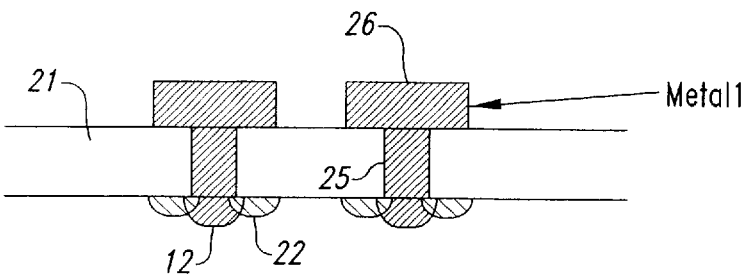

A following metal masking defines metallization areas 26 to which lead the contacts 25 as shown in FIG. 17 which corresponds essentially to FIG. 5A.

The additional manufacturing process steps are entirely conventional and therefore a detailed description thereof is omitted.

It is important to note that in accordance with the instructions contained in the present invention it is not necessary to use an additional masking to provide the N+ implantation of the reception regions 22 of the contacts 25.

This peculiarity is provided even if there is reduced space between the Poly1 polysilicon strips and misalignment between the contact and the polysilicon.

This is allowed by opening in a zone where the contacts are to be provided the mask used to implant and then diffuse the active N+ areas of the N-channel transistors of the outside circuitry.

Figure 14:
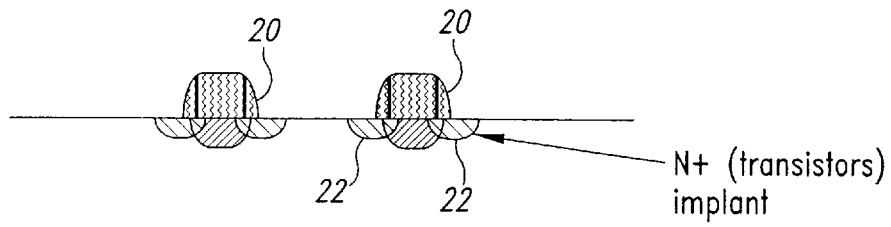

In this manner, even if the N+ implant of the transistors does not reach the regions of the spacing between the Poly1 strips, because shielded by the presence of the planarized dielectric 21, it allows creation of an N+ diffusion sufficiently wide to constitute a 'head' which receives with a broad margin the contact 25 as shown in FIGS. 14, 15 and 16.

Indeed, the N+ implant is provided only outside the region protected by the residual plug 7 of planarized oxide. In fact, the N+ implantation occupies a region which extends beyond the oxide spacers 20 provided during formation of the LDD implants of the peripheral transistors.

Accordingly, it is though the lateral diffusions of the N+ implant associated with the bit line merged in a single unbroken diffusion area of a size such as to receive the contact 25 with a broad margin and such as to compensate for the misalignments typical of the manufacturing process.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A process for manufacturing bit line contacts in a semiconductors, electronic non-volatile memory with a cross-point structure that includes a memory cell matrix, the process comprising:

forming bit lines in a semiconductor substrate, the bit lines being parallel unbroken diffusion strips extending along columns of the matrix;

implanting dopants into the substrate at opposite sides of each bit line to form contact areas, the contact areas diffusing into contact with the respective bit lines to form contact regions with the respective bit lines;

forming a dielectric layer over the contact regions and substrate;

defining contact apertures through the dielectric layer and over the contact regions after the implanting and diffusing steps are completed; and forming contacts in the contact apertures after the implanting and diffusing steps are completed, the contacts being in contact with the respective contact regions.

2. The process in accordance with claim 1 wherein said contact areas are N+ doped.

3. The process in accordance with claim 1 wherein said implantation is provided by using a same mask used to create N+ junctions of N-channel transistors of the circuitry associated with the cell matrix.

4. A method for manufacturing contact structures in a non-volatile memory semiconductor device having a cross-point matrix configuration with parallel diffused strips of bit lines, said each bit line extending along a column direction of said matrix and contacting contact areas in opposite ends of said each bit line, said method comprising:

forming a semiconductor substrate with dopants of a first type conductivity;

forming a covering layer over said semiconductor substrate;

forming bit line openings by removing patterned portions of said covering layer;

depositing dopants of a second type conductivity upon said semiconductor substrate through said bit line openings to form said bit lines;

forming a dielectric plug in each bit line opening;

patterning and removing said covering layer which leaves said dielectric plugs covering over said contact areas in said semiconductor substrate;

implanting dopants of said second type at opposite sides of each bit line predetermined to contact the contact area;

depositing a dielectric layer over the semiconductor substrate;

forming contact openings by removing patterned portions of said dielectric layer and said dielectric plugs;

depositing a metallization material entirely occupying each said contact opening to form metallic contacts; and depositing patterned metallization strips over said dielectric layer and contacting said metallic contacts in contact openings.

5. The method of claim 4 wherein the step of forming said covering layer comprises:

forming a gate oxide layer;

forming a first polysilicon layer over said gate oxide layer;

forming an interpoly dielectric layer over said first polysilicon layer; and forming a second polysilicon layer over said interpoly dielectric layer.

6. The method of claim 4 wherein the step of depositing dopants to form bit lines comprises an ion implantation of dopants of the second type conductivity.

7. The method of claim 4 wherein the step of depositing dopants to form bit lines comprises an ion implantation of dopants of the second type conductivity for bit lines contacting drain regions of memory cells and an ion implantation of dopants of the first and the second type conductivity for bit lines contacting source regions.

8. The method of claim 4, further comprising depositing a conductive layer over said semiconductor substrate after the step of forming a dielectric plug in each bit line opening.

9. The method of claim 8 wherein the step of depositing a conductive layer comprises:

forming a third polysilicon layer; and forming a silicide layer over the third polysilicon layer.

10. The method of claim 4, further comprising forming dielectric spacers adjacent and appurtenant to opposite sides, orthogonal to the bit lines, of each dielectric plug after the step of patterning and removing said covering layer.

11. The method of claim 10, further comprising diffusing the dopants implanted at opposite sides of each predetermined bit line to merge with said predetermined bit line.

12. A method for manufacturing an electrical contact in a semiconductor electronic device, the method comprising:

forming a contact line in a semiconductor substrate;

implanting dopants into the substrate at opposite sides of the bit line to form contact areas, the contact areas diffusing into contact with the bit line to form a contact region with the bit line;

forming a dielectric layer over the contact region and substrate;

defining a contact aperture through the dielectric layer and over the contact region; and filling the contact apertures with an electrically conductive material after the implanting and diffusing steps such that the conductive material contacts the contact region.

13. The method of claim 12 wherein forming a contact line includes:

forming a covering layer over the substrate;

forming a contact line opening by removing a patterned portion of the covering layer; and depositing dopants in the substrate through the contact line opening to form the contact line.

14. The method of claim 13, further comprising:

forming a dielectric plug in the contact line opening;

patterning and removing the covering layer which leaves the dielectric plug covering a portion of the contact line, wherein the implanting step is performed while the dielectric plug is covering the portion of the contact line.

15. The method of claim 14, further comprising forming dielectric spacers immediately adjacent to opposite sides of the dielectric plug after the step of patterning and removing said covering layer, wherein the implanting step is performed while the dielectric spacers are in place next to the dielectric plug.

* * * * *